United States Patent
Chang et al.

(10) Patent No.: US 9,377,496 B2
(45) Date of Patent: Jun. 28, 2016

(54) CANCELLATION OF SECONDARY REVERSE REFLECTIONS IN A VERY-FAST TRANSMISSION LINE PULSE SYSTEM

(71) Applicant: INTERNATIONAL BUSINESS MACHINES CORPORATION, Armonk, NY (US)

(72) Inventors: Shunhua T. Chang, South Burlington, VT (US); James P. Di Sarro, Essex Junction, VT (US); Robert J. Gauthier, Jr., Hinesburg, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/870,332

(22) Filed: Sep. 30, 2015

(65) Prior Publication Data

US 2016/0018452 A1    Jan. 21, 2016

Related U.S. Application Data

(63) Continuation of application No. 13/626,372, filed on Sep. 25, 2012.

(51) Int. Cl.
*G01R 31/00* (2006.01)
*G01R 31/28* (2006.01)

(52) U.S. Cl.
CPC .......... *G01R 31/002* (2013.01); *G01R 31/2839* (2013.01); *G01R 31/2841* (2013.01)

(58) Field of Classification Search
CPC .. G01R 31/002; G01R 31/001; G01R 31/021; G01R 35/005; G01R 1/0408; G01R 31/2841; G01R 31/2839

USPC ........ 324/113, 601, 605, 676, 750.01, 750.02
See application file for complete search history.

(56) References Cited

U.S. PATENT DOCUMENTS

| | | | |
|---|---|---|---|
| 2,602,841 A | 7/1952 | Applegate et al. | |
| 5,638,287 A | 6/1997 | Appel | |
| 5,717,337 A | 2/1998 | Kelly | |
| 7,373,114 B2 | 5/2008 | Yagyu et al. | |
| 7,733,107 B1 | 6/2010 | Barth et al. | |

(Continued)

FOREIGN PATENT DOCUMENTS

JP          11122142          4/1999

OTHER PUBLICATIONS

Koizumi et al., "Enhancement of the Variable-Length-Transmission-Line design method for multi-point optimization", IEEE Congress on Evolutionary Computation, 2006, pp. 142-148.

(Continued)

*Primary Examiner* — Daniel Miller
(74) *Attorney, Agent, or Firm* — Steven J. Meyers; Roberts Mlotkowski Safran & Cole, P.C.

(57) ABSTRACT

An approach for cancelling reverse reflections in very-fast transmission line pulse (VFTLP) testing of an electrostatic discharge (ESD) device in a semiconductor is provided. A method includes generating an incident pulse in a VFTLP system for applying to a device under test (DUT). The method also includes generating a delayed replica of the incident pulse. The method also includes cancelling a portion of a reverse reflection of the incident pulse by combining the delayed replica with the reverse reflection at a power divider.

14 Claims, 6 Drawing Sheets

(56) References Cited

U.S. PATENT DOCUMENTS

| | | |
|---|---|---|
| 2007/0159186 A1 | 7/2007 | Grund |
| 2008/0301352 A1 | 12/2008 | Bland et al. |
| 2008/0315891 A1 | 12/2008 | Grund |
| 2009/0219038 A1 | 9/2009 | Stockinger |
| 2010/0156447 A1 | 6/2010 | Roussel et al. |
| 2011/0187399 A1 | 8/2011 | Laquai |

OTHER PUBLICATIONS

ANSI/ESP SP5.5.2—ESD Association Standard Practice for the Protection of Electrostatic Discharge Susceptible Items, 2007.

CANCELLATION OF SECONDARY REVERSE REFLECTIONS IN A VERY-FAST TRANSMISSION LINE PULSE SYSTEM

FIELD OF THE INVENTION

The present invention relates to testing integrated circuit devices and, more particularly, to methods and systems for very-fast transmission line pulse testing of electrostatic discharge (ESD) devices on a wafer.

BACKGROUND

Transmission line pulse (TLP) testing of electrostatic discharge (ESD) devices is performed by using a high-voltage power supply to charge a cable at a voltage level, followed by discharging the cable into the ESD device, and then measuring the current through the ESD device. The test may be repeated at successively increasing voltage levels, enabling a current vs. voltage curve to be generated until the device fails. In that manner, the TLP testing determines a current level at which the ESD device fails.

Very-fast transmission line pulse testing (VFTLP) is a wafer-level test used to emulate charged device model (CDM) ESD stress. VFTLP includes high-current pulses (e.g., up to and greater than 10 A) with 250 ps rise time and 1 ns pulse width. ESD protection devices are characterized with VFTLP to predict their failure current and protection level during CDM stress. VFTLP failure currents may be reported in the ESD reference guide for each technology and included as a parameter in ESD compact models. Reflections of the pulse within the test system can cause premature failure of the device under test (DUT), which obscures the true forward failure point of the DUT.

Accordingly, there exists a need in the art to overcome the deficiencies and limitations described hereinabove.

SUMMARY

In a first aspect of the invention, there is a method of cancelling reverse reflections in very-fast transmission line pulse (VFTLP) testing of an electrostatic discharge (ESD) device in a semiconductor. The method includes generating an incident pulse in a VFTLP system for applying to a device under test (DUT). The method also includes generating a delayed replica of the incident pulse. The method also includes cancelling a portion of a reverse reflection of the incident pulse by combining the delayed replica with the reverse reflection at a power divider.

In another aspect of the invention, a structure includes a very-fast transmission line pulse (VFTLP) system for testing an electrostatic discharge (ESD) device under test (DUT). The VFTLP system includes: a first leg connected between a power source and a first port of a power divider; a second leg connected between the DUT and a second port of the power divider; and a third leg connected to a third port of the power divider.

In yet another aspect of the invention, there is a very-fast transmission line pulse (VFTLP) system for testing an electrostatic discharge (ESD) device under test (DUT). The VFTLP system includes a power divider comprising first, second, and third ports. The VFTLP system also includes a charge line, a switch, and a first delay line connected in series between a charging resistor and the first port. The VFTLP system also includes a second delay line connected between the second port and the DUT. The VFTLP system also includes a third delay line connected between the third port and an open circuit termination. The power divider and the first, second, and third delay lines are structured and arranged to cancel a portion of a reverse reflection of an incident pulse by generating a delayed replica of the incident pulse and combining the delayed replica with the reverse reflection at the power divider.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a very-fast transmission line pulse (VFTLP) system for testing an electrostatic discharge (ESD) device under test (DUT) which comprises the structures of the present invention. In still further embodiments, a method in a computer-aided design system is provided for generating a functional design model of the VFTLP system. The method comprises generating a functional representation of the structural elements of the VFTLP system.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to testing integrated circuit devices and, more particularly, to methods and systems for very-fast transmission line pulse testing of ESD protection devices on a wafer. According to aspects of the invention, the amplitude of a reverse reflection in a VFTLP system is reduced using passive elements. In embodiments, a symmetric power divider is structured and arranged between first and second legs of a VFTLP system, and a third leg is structured and arranged at one of the ports of the power divider. The first, second, and third legs of the VFTLP system are tuned to create a replica of the incident pulse and combine the replica with the reverse reflection at the power divider in order to cancel the reverse reflection. In particular embodiments, the third leg terminates at an open circuit and has a length that is twice that of each of the first and second legs. In this manner, implementations of the invention provide a VFTLP system in which the reverse reflection is minimized, which reduces the possibility of premature failure of the DUT.

Figure 1:
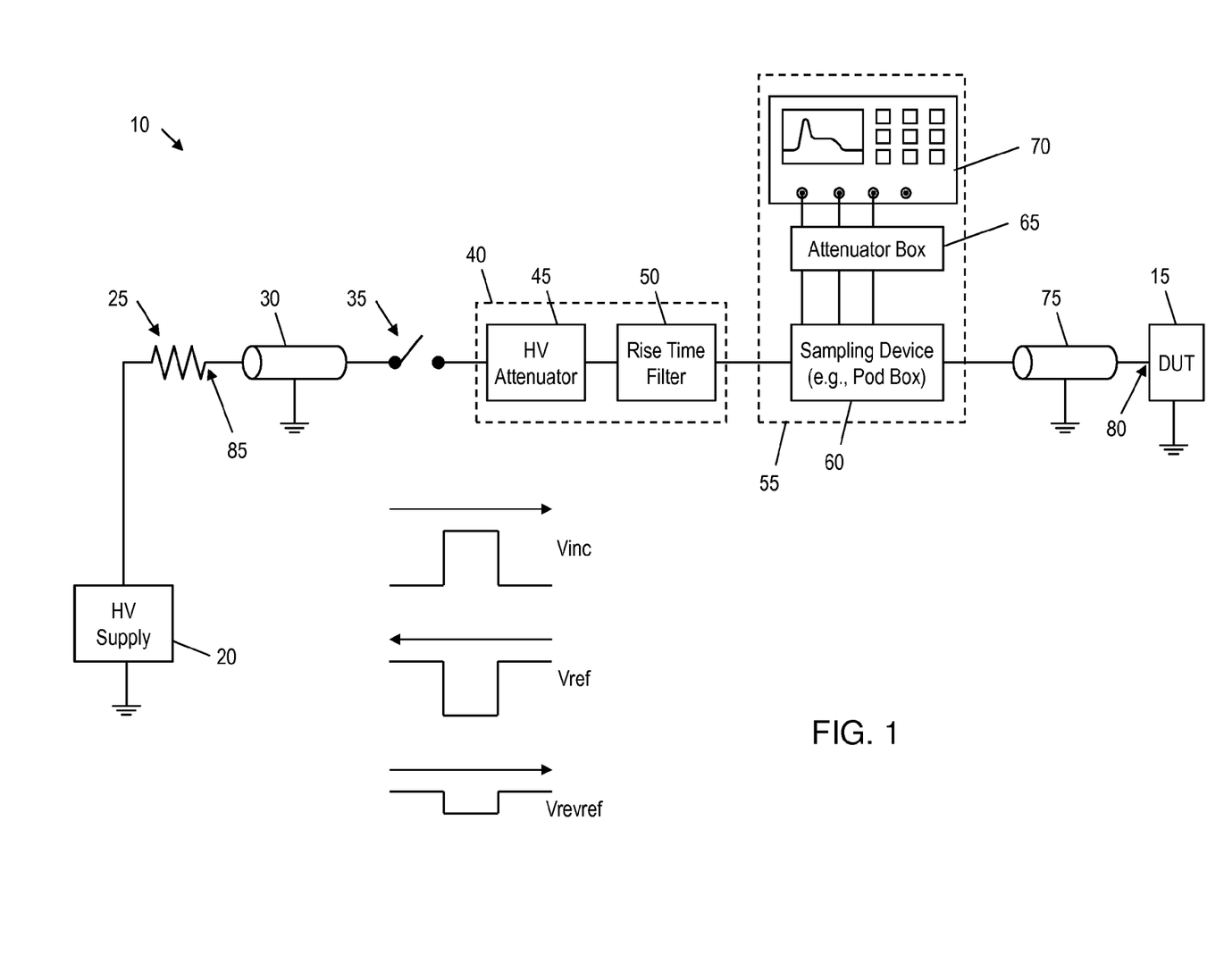
FIG. 1 shows a very-fast transmission line pulse testing (VFTLP) system.

FIG. 1 shows a VFTLP system 10 for testing an ESD protection device included in a device under test (DUT) 15. The system 10 includes a high voltage power supply 20, a charge resistor 25, and a charge line 30 (e.g., delay line, transmission line, etc.) connected on one side of a switch 35. The system 10 optionally includes one or more signal conditioning elements 40, such as a high voltage attenuator 45 and/or a rise time filter 50. The system 10 also includes one or more measuring devices 55, such as a sampling device 60, attenuator 65 and/or oscilloscope 70. The system 10 additionally includes a delay line 75 (e.g., transmission line) that connects the aforementioned elements to the DUT 15.

In operation, the high voltage power supply 20 charges the charge line 30 through the charge resistor 25 while the switch 35 is open. The switch 35 is then closed, which electrically connects the charged charge line 30 to the DUT 15 such that a high current pulse, indicated as "Vinc" in FIG. 1, is applied to the DUT 15. The high voltage power supply 20, charge resistor 25, charge line 30, high voltage attenuator 45, and rise time filter 50 may be collectively configured to provide any desired pulse to the DUT 15. For example, the charge resistor 25 may comprise a 10 MΩ resistor and the high voltage attenuator 45 may comprise a 12 dB attenuator that, in combination with the other elements, produce a 100 V pulse having a 250 ps rise time and a 1 ns pulse width that is applied to the DUT 15.

The elements in the system 10, other than the charge resistor 25, are arranged to have substantially matching impedance, such as about 50Ω. The DUT 15, on the other hand, has a much lower impedance (e.g., about 0.5Ω) by nature of the ESD protection it is designed to provide. The impedance mismatch between the delay line 75 and the DUT 15 forms a termination 80 that is approximated by a short circuit since the impedance of the DUT 15 is close to that of a short circuit but not exactly 0 ohms. The termination 80 thus generates a reflected pulse "Vref" when the incident pulse Vinc arrives at the termination 80. The reflected pulse Vref travels back through the system 10 toward the charge resistor 25, which has a much larger impedance than the charge line 30. The impedance mismatch between the charge resistor 25 and the charge line 30 creates a termination 85 that is approximated by an open circuit since the charge resistor 25 is very large compared to the characteristic impedance of the charge line 30. The termination 85 reflects the reflected pulse Vref, thus producing a reverse reflection pulse "Vrevref" that travels back through the system 10 toward the DUT 15.

Still referring to FIG. 1, the incident pulse Vinc has a particular polarity (e.g., positive). The reflected pulse Vref has an opposite polarity relative to the incident pulse Vinc due to the reflection coefficient F of the termination 80 having a value of about −1. The reverse reflection pulse Vrevref has the same polarity as the reflected pulse Vref such that the reverse reflection pulse Vrevref is opposite in polarity relative to the incident pulse Vinc. The opposite polarity of the reverse reflection pulse Vrevref can cause a premature failure of the DUT 15 since many ESD protection devices are designed to provide protection at a single polarity, i.e., the polarity of the incident pulse Vinc. Thus, when the amplitude of the reverse reflection pulse Vrevref is sufficiently large, the DUT 15 is stressed in reverse breakdown mode. The reverse reflection pulse Vrevref can thus cause a DUT 15 having a low reverse failure current, such as a diode, to fail prematurely during VFTLP testing. For example, reverse reflection can cause premature failure of an ESD diode at 3.5 A when the true failure current of the device is 7 A, which indicates a 50% reduction in observed failure current.

Figure 2:
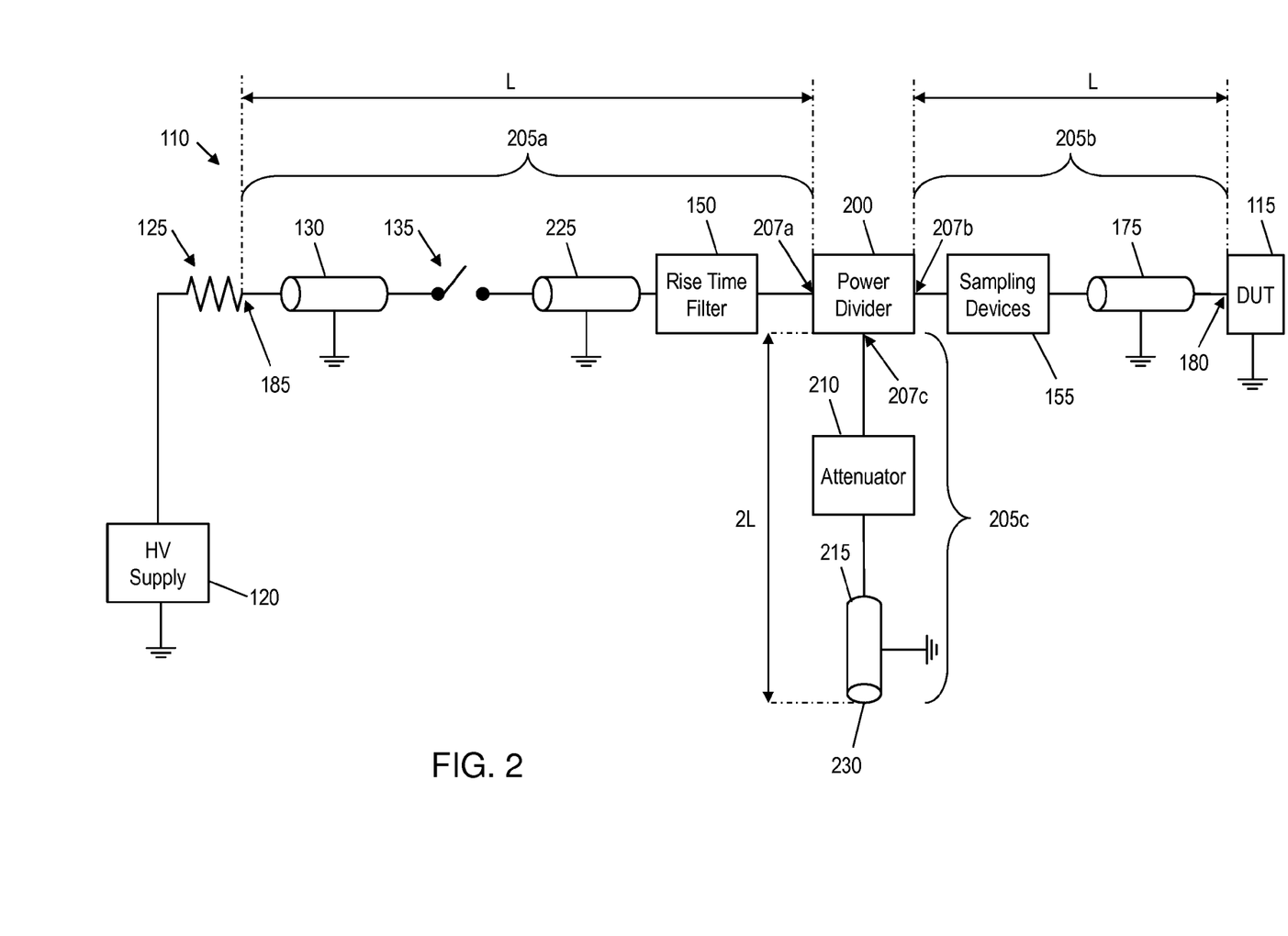
FIGS. 2 and 3 show VFTLP systems in accordance with aspects of the invention.

FIG. 2 shows a VFTLP system 110 with reverse reflection cancelation in accordance with aspects of the invention. The system 100 is electrically connected to a DUT 115 and structured and arranged to perform VFTLP testing of an ESD protection device included in the DUT 115. In embodiments, the system 110 includes a high voltage power supply 120, charge resistor 125, and charge line 130 (e.g., delay line) connected on one side of a switch 135. The system 110 may include one or more signal conditioning elements, such as a rise time filter 150. The system 110 may also include one or more measuring devices 155, such as a sampling device and/or oscilloscope (e.g., as shown in FIG. 1). The system 110 also includes a delay line 175 (e.g., delay line) connected to the DUT 115.

The aforementioned elements of system 110 may be similar to those described above with respect to the system 10 of FIG. 1. For example, the impedance of each of the elements of the system may be configured such that there is an approximate short circuit termination 180 between the delay line 175 and the DUT 115 due to the impedance of the DUT 115 being very small (e.g., approximately 0.5 ohm or less) compared to the characteristic impedance of the transmission lines (e.g., approximately 50 ohms). The impedance of each of the elements of the system may also be configured such that there is an approximate open circuit termination 185 between the charge resistor 125 and the charge line 130, e.g., the charge resistor 125 has a much larger impedance than that of the charge line 125.

Still referring to FIG. 2, and according to aspects of the invention, the system 110 includes a power divider 200 connected between a first leg 205a and a second leg 205b of the circuit. In particular, the first leg 205a, comprising the charge line 130, switch 135, delay line 225, and rise time filter 150, is connected to a first port 207a of the power divider 200. Additionally, the second leg 205b, comprising the delay line 175 and any optional measuring devices 155, is connected to a second port 207b of the power divider 200. In embodiments, a third leg 205c comprising an attenuator 210 and a delay line 215 is connected to a third port 207c of the power divider 200.

In accordance with aspects of the invention, the power divider 200 is a symmetric power divider that splits an input on any one port (e.g., first port 207a) into two substantially equal and half-amplitude outputs on the other two ports (e.g., second and third ports 207b and 207c). For example, the power divider 200 may comprise a symmetric RF (radio frequency) power divider. Moreover, the delay line 215 ends at an open circuit termination 230 that produces a reflection of the same polarity and amplitude of an incoming pulse. In this manner, the power divider 200 and third leg 205c are structured and arranged to create replica pulses of pulses traveling in the first leg 205a and second leg 205b for the purpose of cancelling any reverse reflection pulse (e.g., Vrevref) by destructive interference.

In embodiments, a length of the third leg 205c is twice the length of each of the first leg 205a and the second leg 205b. For example, as depicted in FIG. 2, the first leg 205a and second leg 205b may each have a length "L" and the third leg 205c may have a length "2 L". The length of each leg 205a-c may be structured and arranged to achieve this length relationship by appropriately selecting and structuring the lengths of the delay lines 175, 215, and 225.

With continued reference to FIG. 2, the power divider 200 and the terminations 180, 185, and 230 combine to produce a plurality of reflection pulses within the system 110 due to a single incident pulse Vinc. In embodiments, the length relationship of the three legs (e.g., third leg 205c having length 2 L and first and second legs 205a and 205b each having length L), causes replica pulses created and reflected in the third leg 205c to meet other reflected pulses traveling in the first leg 205a or second leg 205b at the power divider 200. In this manner, the replica pulses created and reflected in the third leg 205c cancel (e.g., attenuate) the other reflected pulses traveling in the first leg 205a or second leg 205b. Moreover, the length relationship provides a maximum number of reflection cancelations within the system 110, such that a reverse reflected pulse (e.g., Vrevref) that eventually hits the DUT 115 is minimized. Stated differently, the DUT 115 is stressed by a final reverse reflection pulse that has made several round trips through the power divider 200, such that the amplitude of the final reverse reflection pulse is significantly reduced from its initial amplitude.

Figure 3:
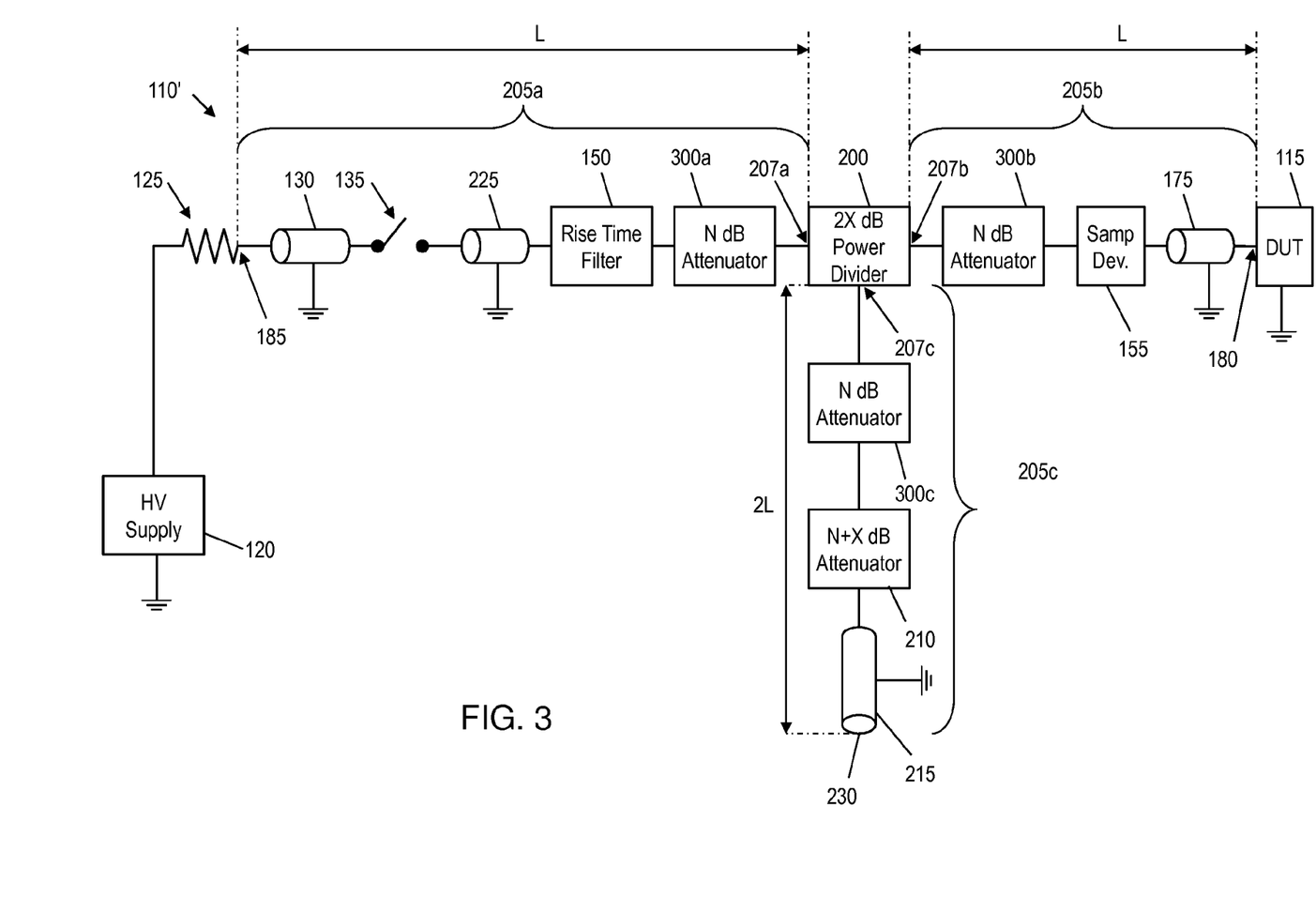

FIG. 3 shows a VFTLP system 110' with reverse reflection cancelation in accordance with aspects of the invention. The system 110' of FIG. 3 is similar to the system 110 shown in FIG. 2, with like reference numbers indicating like elements. In the embodiment shown in FIG. 3, the system 110' includes attenuators 300*a-c* connected in series in the respective legs 205*a-c*. The attenuators 300*a-c* may be used to set the total system attenuation of the system 100', e.g., to set the amplitude of the incident pulse (e.g., Vinc) that is provided to the DUT 115.

In implementations, each one of the attenuators 300*a-c* has a same attenuation value of "N" dB, where N is a non-negative real number. When N=0, the system 110' of FIG. 3 is the same as the system 110 of FIG. 2.

Still referring to FIG. 3, in an exemplary embodiment, each of the attenuators 300*a-c* is an N dB attenuator, the attenuator 210 is an N+X dB attenuator, and the power divider 200 is a 2X dB power divider, where X is a real number greater than zero, although other configurations may be used within the scope of the invention. In this particular implementation, a bounce diagram analysis can be used to show that the largest reverse reflection in the system 110' will be attenuated by a factor of 8N+18 dB relative to the incident pulse Vinc when X=3.

The systems 110 and 110' of FIGS. 2 and 3 may be VFTLP systems used to emulate charged device models for ESD testing in semiconductors. As such, aspects of the invention includes method for cancelling reverse reflections in VFTLP systems used to emulate charged device models for ESD testing in semiconductors. The methods may include providing a delayed replica of an incident pulse and combining the delayed replica with a reverse reflection at a power divider to cancel the reverse reflection.

Figures 4, 5:
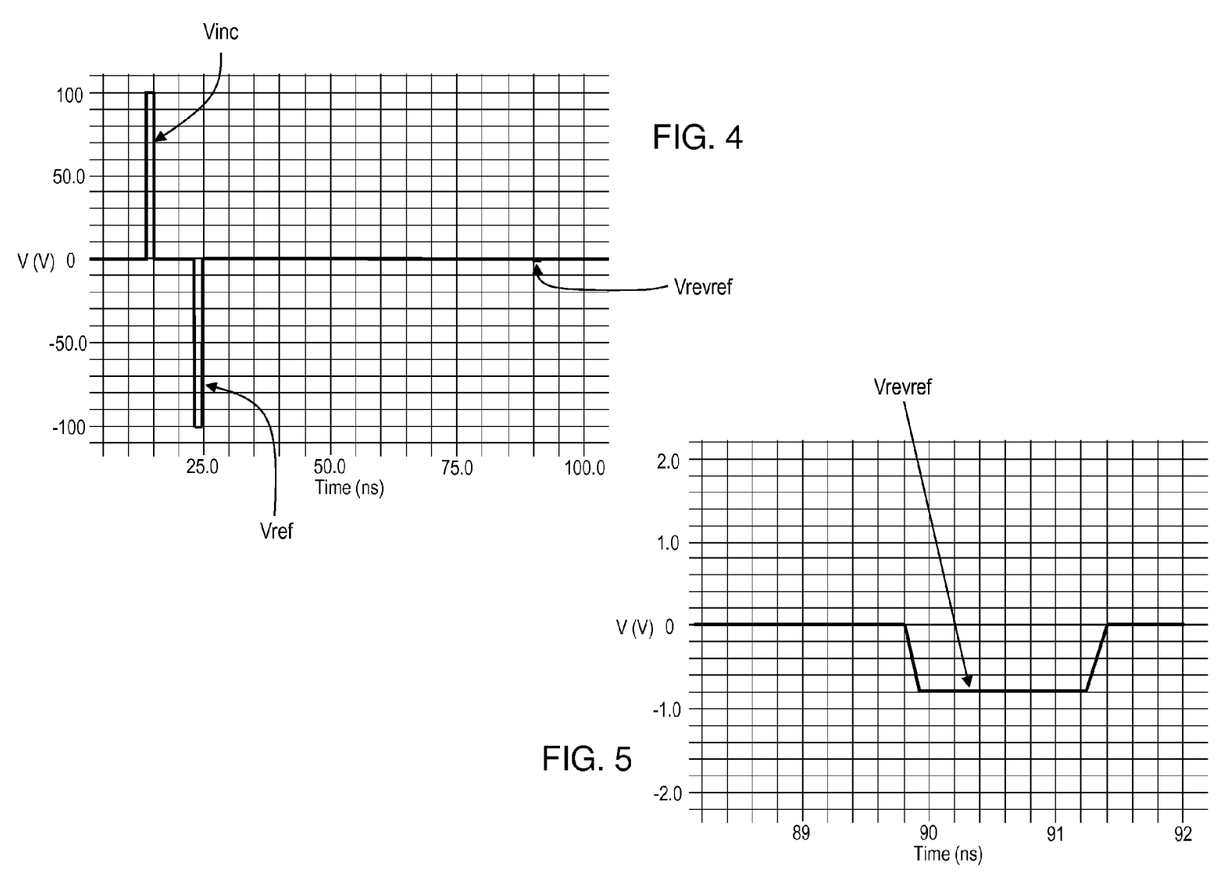
FIGS. 4-6 show simulations of reverse reflections in accordance with aspects of the invention.

FIGS. 4 and 5 show simulation data of the system 110' of FIG. 3 in which each of the attenuators 300*a-c* is an N dB attenuator, the attenuator 210 is an N+X dB attenuator, the power divider 200 is a 2X dB power divider, where N=3 and X=3. The y-axis shows voltage and the x-axis shows time. In particular, FIG. 4 shows the incident pulse Vinc, the reflected pulse Vref, and the final reverse reflected pulse Vrevref that is applied to the DUT (e.g., DUT 115) in the system 110'. FIG. 5 shows a magnified view of the final reverse reflected pulse Vrevref of FIG. 4.

As depicted in the example shown in FIGS. 4 and 5, the incident pulse Vinc has a amplitude of 100 V. The reflected pulse Vref has an amplitude of −100 V (e.g., the same as Vinc) and has the opposite polarity of Vinc. The final reverse reflected pulse Vrevref that is applied to the DUT (e.g., DUT 115) has an amplitude of less than −1 V (e.g., about −0.8 V as shown in FIG. 5). This demonstrates that the final reverse reflected pulse Vrevref that is applied to the DUT is attenuated by about 125 times (e.g., about 42 dB) relative to the incident pulse Vinc.

Figure 6:
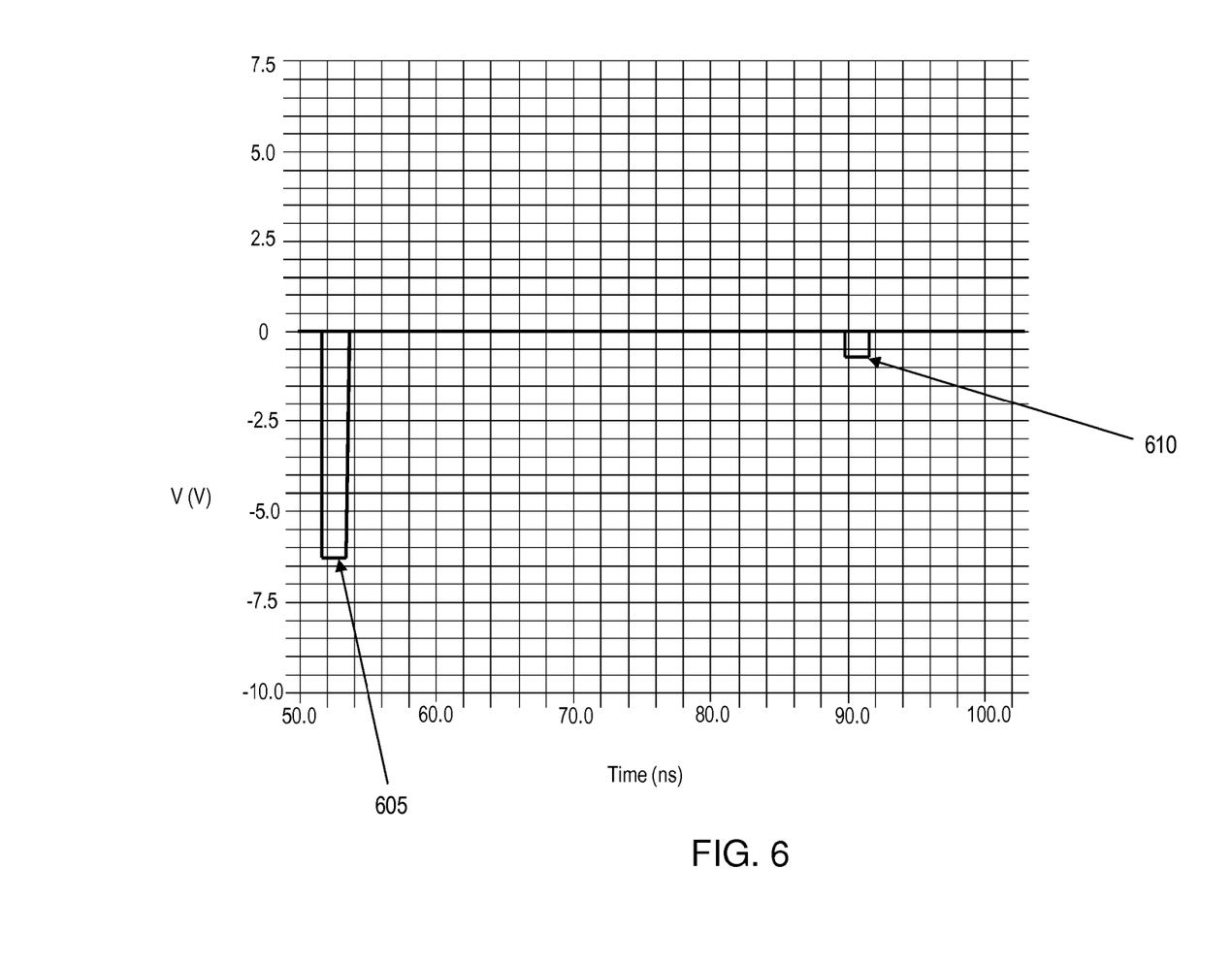

FIG. 6 illustrates a comparison of the attenuation of the reverse reflected pulse between a system in accordance with aspects of the invention (e.g., system 110' of FIG. 3) and another VFTLP system (e.g., system 10 of FIG. 1). The y-axis shows voltage and the x-axis shows time. In particular, FIG. 6 shows a reverse reflected pulse Vrevref 605 in the system 10 of FIG. 1 in which the attenuator 45 has a value of 12 dB and the incident pulse has a amplitude of 100 V. FIG. 6 also shows a reverse reflected pulse Vrevref 610 in the system 110' of FIG. 3 in which each of the attenuators 300*a-c* is an N dB attenuator, the attenuator 210 is an N+3 dB attenuator, the power divider 200 is a 6 dB power divider, N=3, X=3, and the incident pulse has a amplitude of 100 V. The reverse reflected pulse Vrevref 605 of system 10 has a amplitude of about −6.4 V, whereas the reverse reflected pulse Vrevref 610 of system 110' has a amplitude of about −0.8 V.

Mathematical analysis of the systems 10 and 110' reveals that, for a same attenuation in the incident pulse path (e.g., as described with respect to FIG. 6), the system 110' attenuates the reverse reflected pulse Vrevref by 4N+6 dB more than the system 10. Thus, starting with a same amplitude incident pulse (e.g., Vinc=100 V), the system 110' provides 18 dB (18=4N+6, where N=3 and X=3) more cancelation of the reverse reflected pulse Vrevref than does the system 10. Stated differently, the amplitude of the reverse reflected pulse Vrevref 605 in system 10 equals the amplitude of the incident pulse Vinc reduced by 24 dB (2*12 dB), whereas the amplitude of the reverse reflected pulse Vrevref 610 in system 110' equals the amplitude of the incident pulse Vinc reduced by 42 dB (8N+18, where N=3 and X=3).

By reducing the amplitude of the reverse reflection pulse in a VFTLP system, implementations of the invention enable a greater maximum current to be achieved prior to the point at which the reverse reflection becomes destructive. In this manner, implementations of the invention permit accurate failure current to be observed for large ESD protection devices under 1 ns pulsed conditions.

In accordance with aspects of the invention, attenuation of the reverse reflection is achieved using passive devices, such as the power divider 200, attenuators 300*a-c*, and delay lines (e.g., transmission lines) 175, 215, 225 described with respect to FIG. 3. In this manner, implementations of the invention do not rely on active devices, such as discrete diodes in the main pulse path (or in parallel) to suppress reverse reflection. Implementations of the invention thus avoid undesired properties associated with active devices, such as high breakdown voltage diodes, which include: present large parasitic loads that increase the rise time of the incident pulse; diode turn on time that may not be suitable for 1 ns VFTLP; and the need to change the diode direction when changing the incident pulse polarity.

Implementations of the invention thus provide a method for cancelling reflections in a transmission line circuit with a mismatched load impedance. In embodiments, the method includes: generating a delayed replica of an incident pulse, and combining the replica with the reflection produced by a load with mismatched impedance to cancel the reflection.

Implementations of the invention also provide a structure for cancelling a reverse reflection in a VFTLP tester. In embodiments, the structure includes a VFTLP system augmented with a symmetrical power divider, attenuators, and transmission lines of specified length. A first port of the power divider is connected to the series combination of charge line, relay, optional rise time filter, optional attenuator, and delay line, all having a total electrical length of "L". A second port of the power divider is connected to the series combination of delay lines, optional attenuator, optional voltage/current measurement module, and wafer level probes (e.g. at the DUT), all having a total electrical length of "L". A third port of the power divider is connected to the series combination of an optional attenuator, a second attenuator of specified value, and a delay line terminated by an open circuit, all having a total electrical length of "2 L".

Figure 7:
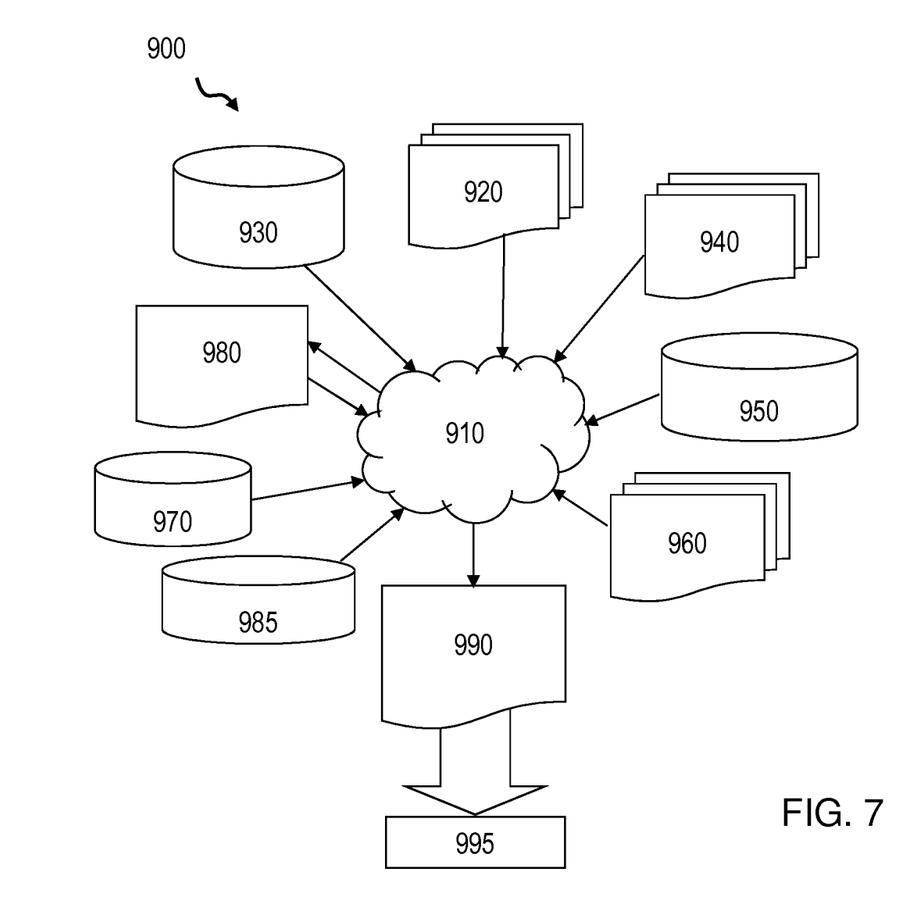
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2-3. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-3 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-3. In one embodiment, design structure 990 may comprise a compiled, executable HDL simulation model that functionally simulates the devices shown in FIGS. 2-3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-3. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A system, comprising:
    a very-fast transmission line pulse (VFTLP) system that is configured to:
        generate and apply an incident pulse to a device under test (DUT);
        generate a delayed replica of the incident pulse; and
        cancel a portion of a reverse reflection of the incident pulse by combining the delayed replica with the reverse reflection at a power divider,
    wherein the power divider is between first and second legs of the VFTLP system;
    the first leg is connected to a first port of the power divider, and the second leg is connected to a second port of the power divider, and further comprising a third leg connected to a third port of the power divider; and
    the third leg ends in an open circuit termination.

2. The system of claim 1, wherein the VFTLP system generates the incident pulse using a high voltage power supply, a charge resistor, and a charge line associated with the first leg.

3. The system of claim 1, wherein the VFTLP system comprises lengths of transmission lines in the first leg, the second leg, and the third leg to maximize a number of reflection cancelations.

4. The system of claim 1, wherein the VFTLP system comprises lengths of transmission lines in the first leg, the second leg, and the third leg such that an electrical length of the first leg is L, an electrical length of the second leg is L, and an electrical length of the third leg is 2 L.

5. The system of claim 1, further comprising a respective attenuator connected in series in each of the first leg, the second leg, and the third leg.

6. The system of claim 5, further comprising:
    an N dB attenuator in each of the first, second, and third legs, where N is a first real number greater than zero; and
    an N+X db attenuator in the third leg, where X is a second real number greater than zero.

7. The system of claim 1, wherein the VFTLP system comprises the power divider and the first, second, and third legs connected to the power divider.

8. A system, comprising:
    a very-fast transmission line pulse (VFTLP) system that is configured to:
        generate and apply an incident pulse to a device under test (DUT);
        generate a deli replica of the incident pulse; and
        cancel a portion of a reverse reflection of the incident pulse by combining the delayed replica with the reverse reflection at a power divider,
    wherein the power divider is between first and second legs of the VFTLP system;
    the first leg is connected to a first port of the power divider, and the second leg is connected to a second port of the power divider, and further comprising a third leg connected to a third port of the power divider; and
    the third lea ends in an open circuit termination;
    further comprising a respective attenuator connected in series in each of the first leg, the second leg, and the third leg;
    wherein the power divider is a symmetric power divider, and further comprising:
        a rise time filter connected in series in the first leg; and
        a measuring device connected in series in the second leg.

9. The system of claim 8, wherein the VFTLP system comprises the power divider and the first, second, and third legs connected to the power divider.

10. A system, comprising:
    a very-fast transmission line pulse (VFTLP) system that is configured to:
        generate and apply an incident pulse to a device under test (DUT);
        generate a delayed replica of the incident pulse; and
        cancel a portion of a reverse reflection of the incident pulse by combining the delayed replica with the reverse reflection at a power divider,
    wherein the VFTLP system comprises:
        the power divider;
        a high voltage power supply and at least one signal conditioning element in a first leg connected to a first port of a power divider; and
        at least one measuring device in a second leg connected to a second port of the power divider, wherein the second leg is configured to be connected to the DUT.

11. The system of claim 10, wherein the at least one signal conditioning element comprises at least one of:
    a high voltage attenuator; and
    a rise time filter.

12. The system of claim 10, wherein the at least one measuring device comprises at least one of:
    a sampling device;
    an attenuator; and
    an oscilloscope.

13. The system of claim 10, further comprising a third leg connected to a third port of the power divider, wherein the third leg ends in an open circuit termination.

14. The system of claim 13, wherein the second leg comprises an attenuator connected between the at least one measuring device and the DUT.

* * * * *